(12) United States Patent
Wang et al.

(10) Patent No.: US 10,490,452 B2
(45) Date of Patent: Nov. 26, 2019

(54) METHOD FOR FABRICATING A SEMICONDUCTOR DEVICE

(71) Applicant: TAIWAN SEMICONDUCTOR MANUFACTURING CO., LTD., Hsinchu (TW)

(72) Inventors: Tsan-Chun Wang, Hsinchu (TW); Chung-Feng Nieh, Hsinchu (TW); Chiao-Ting Tai, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/938,477

(22) Filed: Mar. 28, 2018

(65) Prior Publication Data
US 2019/0006242 A1   Jan. 3, 2019

Related U.S. Application Data

(60) Provisional application No. 62/527,930, filed on Jun. 30, 2017.

(51) Int. Cl.
*H01L 21/8234* (2006.01)
*H01L 21/3115* (2006.01)
(Continued)

(52) U.S. Cl.
CPC ......... *H01L 21/823431* (2013.01); *H01L 21/26506* (2013.01); *H01L 21/26586* (2013.01);
(Continued)

(58) Field of Classification Search
None
See application file for complete search history.

(56) References Cited

U.S. PATENT DOCUMENTS

2010/0240204 A1   9/2010   Yeh et al.
2011/0306196 A1*  12/2011  Hsu .................. H01L 21/82345
                                                    438/591
(Continued)

FOREIGN PATENT DOCUMENTS

TW    201631766 A    9/2016
WO    2017111770 A1  6/2017

*Primary Examiner* — Asok K Sarkar
(74) *Attorney, Agent, or Firm* — McDermott Will & Emery LLP

(57) ABSTRACT

A method for fabricating a semiconductor device includes forming a fin extending along a first direction on a semiconductor substrate and forming a sacrificial gate electrode structure extending along a second direction substantially perpendicular to the first direction over the fin. The sacrificial gate electrode structure comprises a sacrificial gate dielectric layer and a sacrificial gate electrode layer disposed over the sacrificial gate dielectric layer. Opposing gate sidewall spacers are formed extending along the second direction, on opposing sides of the sacrificial gate electrode layer. The sacrificial gate electrode layer is removed to form a gate space. Fluorine is implanted into the gate sidewall spacers after removing the gate electrode layer by performing a first fluorine implantation. The sacrificial gate dielectric layer is removed and a high-k gate dielectric layer is formed in the gate space. Fluorine is implanted into the gate sidewall spacers and the fin after forming the high-k gate dielectric layer by performing a second fluorine implantation.

20 Claims, 20 Drawing Sheets

(51) Int. Cl.
*H01L 21/265* (2006.01)
*H01L 27/088* (2006.01)
*H01L 29/51* (2006.01)
*H01L 21/28* (2006.01)

(52) U.S. Cl.
CPC .......... *H01L 21/31155* (2013.01); *H01L 21/823412* (2013.01); *H01L 21/823462* (2013.01); *H01L 21/823468* (2013.01); *H01L 27/0886* (2013.01); *H01L 29/517* (2013.01); H01L 21/2822 (2013.01); H01L 21/28167 (2013.01); H01L 21/28238 (2013.01)

(56) References Cited

U.S. PATENT DOCUMENTS

| | | |
|---|---|---|
| 2016/0042952 A1 | 2/2016 | Tsai et al. |
| 2016/0204039 A1 | 7/2016 | Togo |
| 2017/0040310 A1* | 2/2017 | Xie ............... H01L 27/088 |
| 2017/0221889 A1* | 8/2017 | Dasgupta ......... H01L 27/0886 |

* cited by examiner

METHOD FOR FABRICATING A SEMICONDUCTOR DEVICE

CROSS-REFERENCE TO RELATED APPLICATIONS

This application claims priority to U.S. Provisional Patent Application 62/527,930 filed Jun. 30, 2017, the entire disclosure of which is incorporated herein by reference.

TECHNICAL FIELD

The disclosure relates to methods for improving the performance of semiconductor devices, such as ring oscillators, by reducing the effective capacitance of the device.

BACKGROUND

High-k materials (k>5.0) are used as insulating spacer materials in semiconductor devices. It is desirable to modify the k-value to improve device performance. In addition, device performance suffers when dopants diffuse into the channel region from the source/drain regions of a semiconductor device. It is desirable to prevent dopant diffusion into the channel region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2B is orthogonal to FIG. 2A.

FIG. 4B is orthogonal to FIG. 4A.

DETAILED DESCRIPTION

Figure 1:
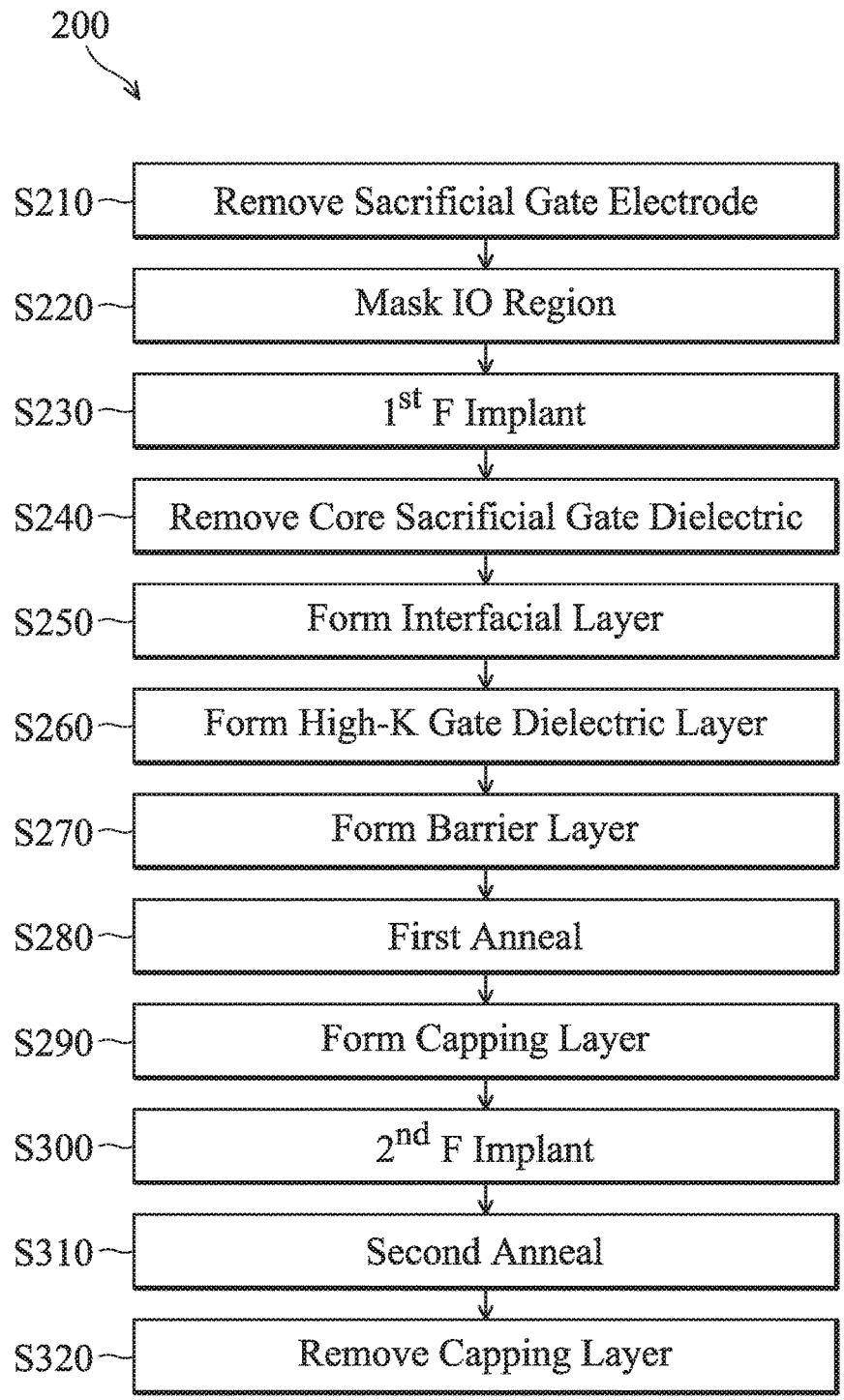
FIG. 1 is a flowchart of a method for fabricating a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The disclosure relates to methods for improving the performance of semiconductor devices, such as ring oscillators, by reducing the effective capacitance in the device. Reducing the capacitance improves the response time of ring oscillators.

It has been found that implanting fluorine into the gate sidewall spacers and the channel regions of semiconductor devices, such as a device including fin-type field effect transistors (FinFET), reduces the capacitance of the spacer and retards diffusion of channel dopants into the channel region from the source/drain regions.

For example, silicon sidewall, which is used for sidewall spacers of the gate electrode, has a k-value of about 5.01 to about 5.06. A thermal annealing operation and a single fluorine implantation after forming the silicon nitride sidewall spacers reduce the k-value of the silicon nitride by about 2.58%. Further, a first fluorine implantation before removing a sacrificial gate oxide, followed by a thermal anneal and a subsequent second fluorine implantation after forming the silicon nitride sidewall spacers results in about a 5.78% reduction of the k-value, in some embodiments.

In addition, according to embodiments of the present disclosure, the fluorine implantation operations retard diffusion of B in SiGe:B regions that are used for source/drain regions, and retards diffusion of P in SiP regions that are used for source/drain regions, into the sidewall spacers and/or channel regions. It is believed the implanted fluorine blocks end-of-range defects (i.e.—interstitials that cause diffusion). By blocking the interstitials, dopant diffusion is blocked. The effective channel length of a semiconductor device can be increased by as much as 0.1 μm by implantation with a fluorine dose of $2 \times 10^{15}$ atoms/cm$^2$, in some embodiments. It is believed the increased effective channel length is due to the fluorine retarding phosphorus lateral diffusion in some embodiments.

FIG. 1 is a flowchart of a method 200 for fabricating a semiconductor device according to an embodiment of the present disclosure. A semiconductor device including Fin-FET structures is provided in some embodiments. In some embodiments for manufacturing a FinFET, a gate replacement technology is employed, in which sacrificial gate electrode structures including sacrificial gate electrodes disposed over sacrificial gate dielectric layers are formed over a fin. Insulating gate sidewalls are disposed on opposing side surfaces of the sacrificial gate electrodes. In operation S210 the sacrificial gate electrodes are removed thereby forming gate spaces surrounded by the gate sidewalls over the fin.

The semiconductor device includes core regions and input/output (IO) regions in some embodiments. The IO regions are masked in operation S220. After masking the IO regions, fluorine is implanted into the semiconductor device in the unmasked core regions in operation S230. The sacrificial gate dielectric layer is removed in operation S240 after implanting fluorine. An interfacial layer is subsequently formed on the fin in operation S250 in the gate space where the sacrificial gate dielectric layer was removed. A high-k gate dielectric layer is formed over the interfacial layer and lining the gate space in operation S260. Then, in operation S270 a bather layer is formed overlying the high-k gate dielectric layer. A first annealing operation is performed in operation S280 after forming the barrier layer. A capping layer is formed after the first annealing in operation S290. A second fluorine implantation operation is subsequently performed in operation S300, and then a second annealing operation is performed in operation S310. In some embodiments, the capping layer is removed in operation S320 prior to further processing of the semiconductor device.

FIGS. 2A-17 illustrate various stages of a semiconductor device fabrication process in accordance with embodiments of the present disclosure. It is understood that additional operations can be provided before, during, and after processes shown by FIGS. 2A-17, and some of the operations described below can be replaced or eliminated, for other embodiments of the method. The order of the operations/processes may be interchangeable.

Figure 2A:
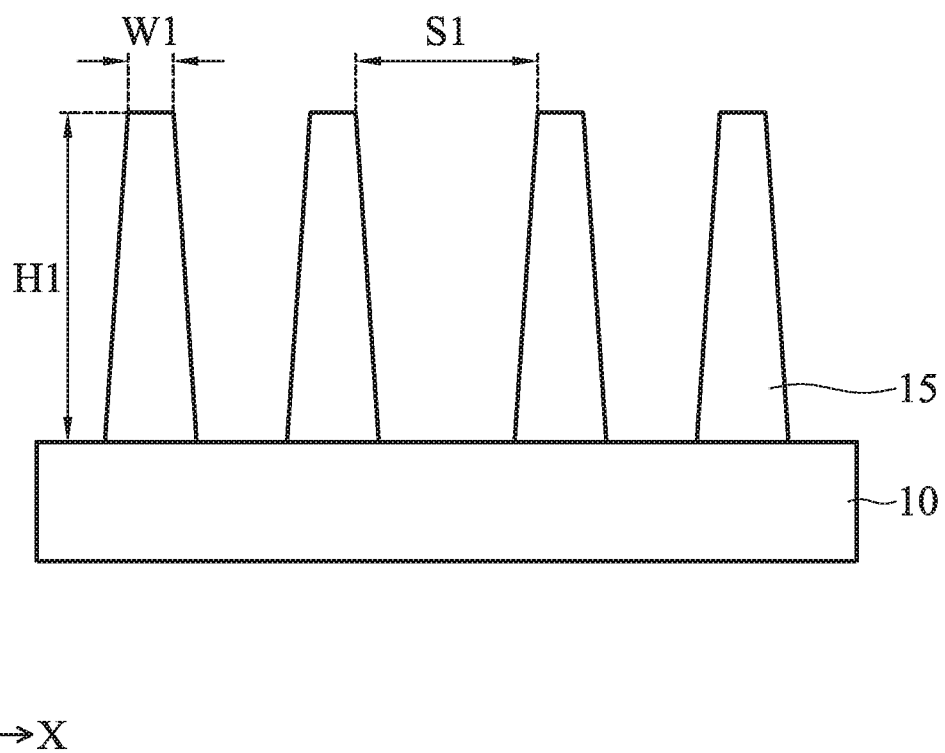
FIGS. 2A and 2B are cross sectional views of a stage of a sequential process for manufacturing a semiconductor device according to an embodiment of the present disclosure.
Figure 2B:
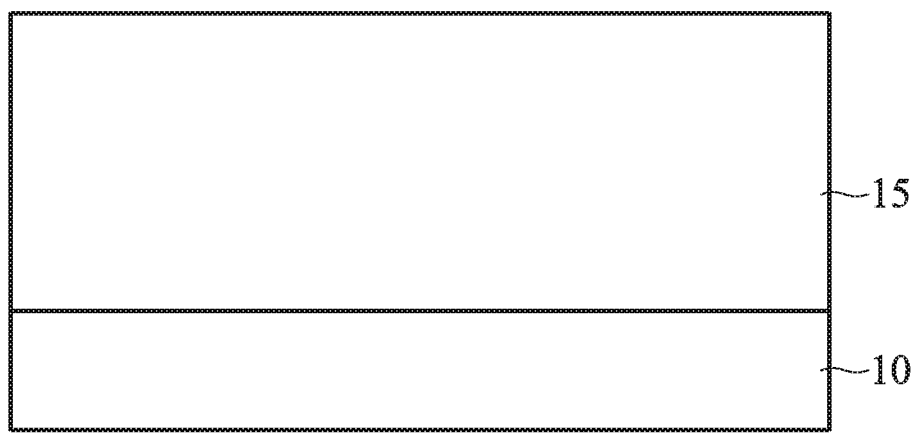

FIGS. 2A and 2B are cross sectional views of a stage of a sequential process for manufacturing a semiconductor device according to an embodiment of the present disclosure. FIG. 2B is orthogonal to FIG. 2A. As shown in FIG. 2A, a plurality of fins 15 are formed over a semiconductor substrate 10. In some embodiments, the fins 15 are formed in the substrate 10 by patterning the substrate 10 using photolithography techniques and etching the substrate. In other embodiments, the fins 15 are formed on the substrate 10 using photolithography and epitaxial deposition techniques. FIG. 2B is a cross sectional view along a fin 15 in the Y direction.

The fins 15 may be patterned by any suitable method. For example, the fins 15 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 15.

In some embodiments, one or more dummy fins are formed on both sides of the fins 15 to improve pattern fidelity in the patterning operations. Channel regions are formed in the upper portions of the fins 15 and wells are formed in the lower portions of the fins.

The width W1 of the upper portion of the fins 15 along the X direction is in a range from about 5 nm to about 40 nm in some embodiments, and is in a range from about 10 nm to about 30 nm in other embodiments. The height H1 along the Z direction of the fin is in a range from about 75 nm to about 300 nm in some embodiments, and is in a range of about 100 nm to about 200 nm in other embodiments. Adjacent fins are spaced-apart from each other by a distance S1 along the X direction ranging from about 10 nm to about 100 nm in some embodiments, and about 20 nm to about 50 nm in other embodiments.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP.

In some embodiments, impurity ions (dopants) are implanted into a silicon substrate 10 to form a well region. The ion implantation is performed to prevent a punch-through effect. The substrate 10 may include various regions that have been suitably doped with impurities (e.g., p-type or n-type conductivity). The dopants are, for example, boron ($BF_2$) for an p-type Fin FET and phosphorus for n-type Fin FET.

While four fins 15 are illustrated in FIG. 2A, the number of fins 15 is not limited to four, and the number of fins can be fewer than four in some embodiments and greater than four in other embodiments.

After the fins 15 are formed, an insulating material layer including one or more layers of insulating material is formed over the substrate so that the fins are fully embedded in the insulating layer. The insulating material for the insulating layer may include silicon oxide, silicon nitride, silicon oxynitride (SiON), SiOCN, SiCN, fluorine-doped silicate glass (FSG), or a low-K dielectric material, formed by low pressure chemical vapor deposition (LPCVD), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surfaces of the fins are exposed from the insulating material layer. In some embodiments, a fin liner layer is formed over the fins before forming the insulating material layer. The fin liner layer is made of $Si_3N_4$ or a silicon nitride-based material (e.g., SiON, SiCN, or SiOCN) in some embodiments.

In some embodiments, the fin liner layers include a first fin liner layer formed over the substrate and sidewalls of the bottom part of the fins 15, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), including sputtering, chemical vapor deposition (CVD), or atomic layer deposition (ALD), although any acceptable process may be utilized.

Figure 3:
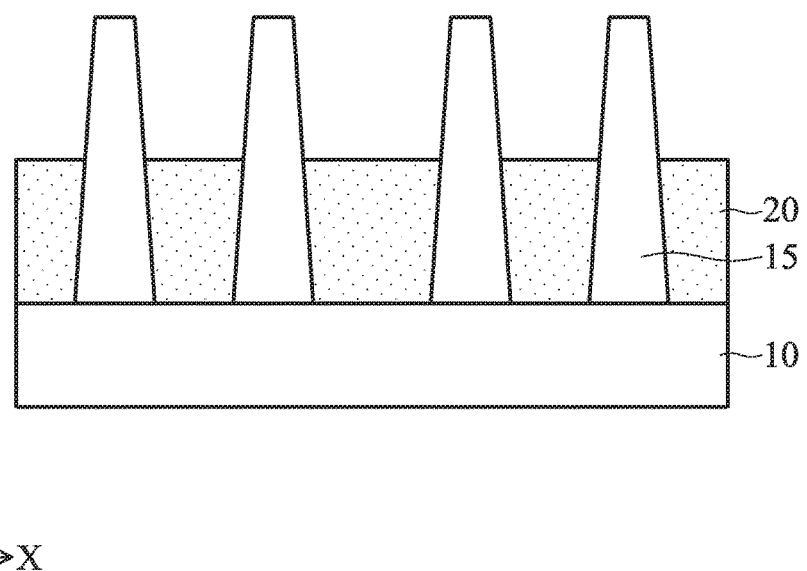
FIG. 3 is a cross sectional view of a stage of a sequential process for manufacturing a semiconductor device according to an embodiment of the present disclosure.

Then, as shown in FIG. 3, the insulating material layer is recessed to form an isolation insulating layer 20 so that the upper portions of the fins 15 are exposed. With this operation, the fins 15 are electrically separated from each other by the isolation insulating layer 20, which is also called a shallow trench isolation (STI).

Figure 4A:
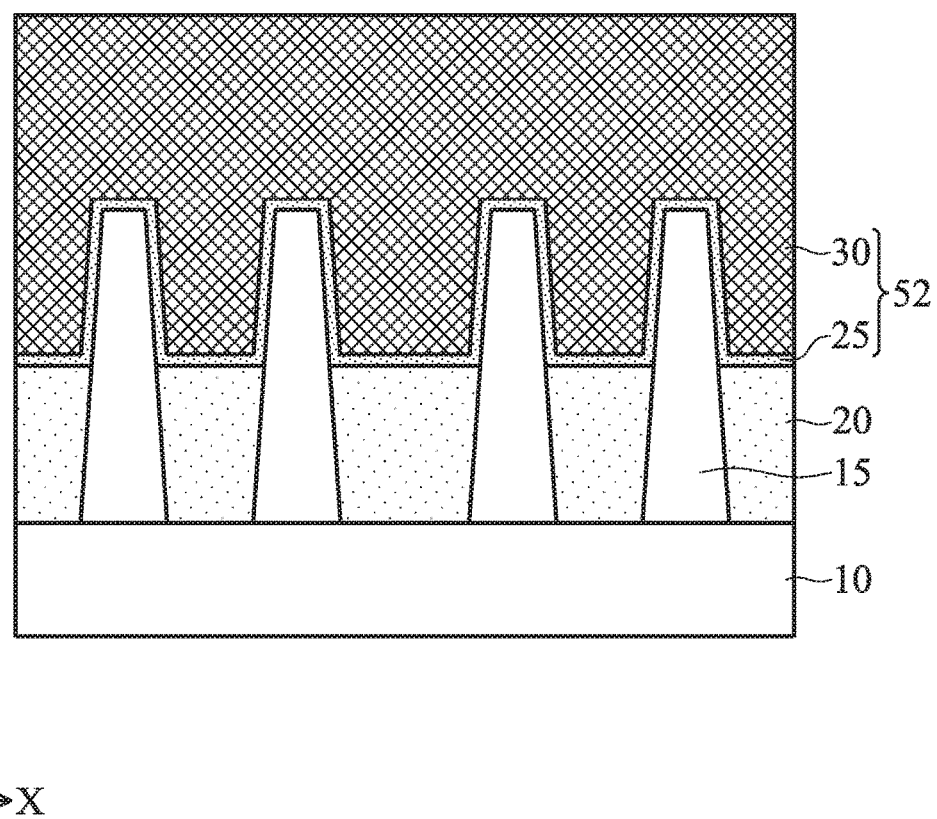
FIGS. 4A and 4B are cross sectional views of a stage of a sequential process for manufacturing a semiconductor device according to an embodiment of the present disclosure.
Figure 4B:
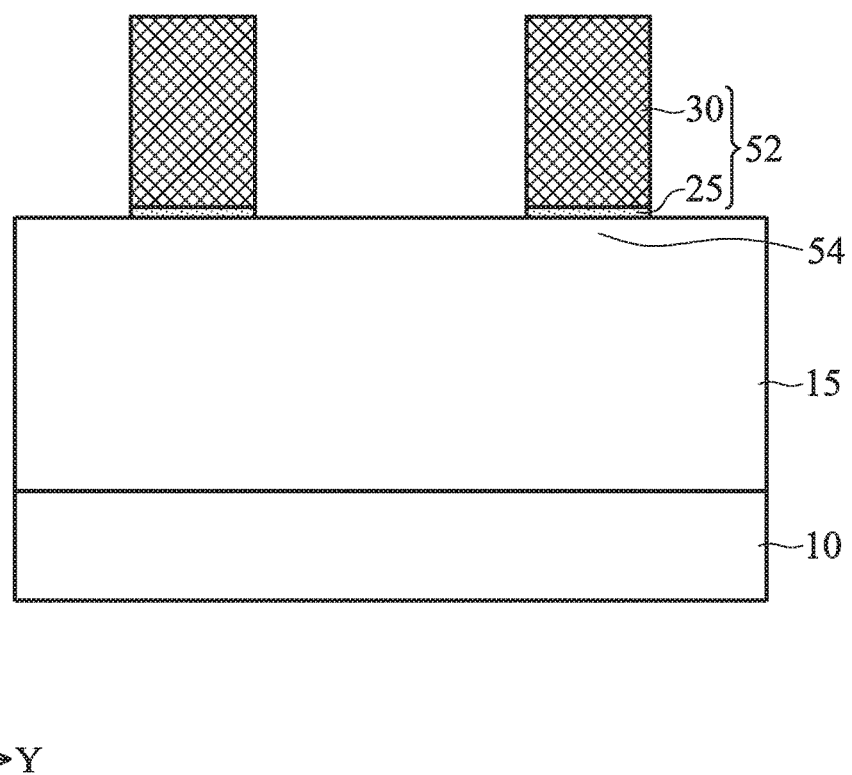

After the isolation insulating layer 20 is formed, a sacrificial gate structure 52 is formed, as shown in FIGS. 4A and 4B. FIG. 4A is a cross sectional view taken along the gate electrode in the X-direction. FIG. 4B is a cross sectional view taken along the fins in the Y-direction. The sacrificial gate structure 52 is formed over a portion of the fins 15 which is to be a channel region 54. The sacrificial gate structure 52 defines the channel region 54 of the FinFET. The sacrificial gate structure 52 includes a sacrificial gate dielectric layer 25 and a sacrificial gate electrode layer 30. The sacrificial gate dielectric layer 25 includes one or more layers of insulating material, such as a silicon oxide-based material. In one embodiment, silicon oxide formed by CVD or thermal oxidation is used. The thickness of the sacrificial gate dielectric layer 25 is in a range from about 1 nm to about 5 nm in some embodiments.

The sacrificial gate structure 52 is formed by first blanket depositing the sacrificial gate dielectric layer 25 over the fins 15. A sacrificial gate electrode layer 30 is then blanket deposited on the sacrificial gate dielectric layer 25 and over the fins 15, such that the fins 15 are fully embedded in the sacrificial gate electrode layer 30. The sacrificial gate electrode layer 30 includes silicon, such as polycrystalline silicon or amorphous silicon in some embodiments. The thickness of the sacrificial gate electrode layer 30 is in a range from about 100 nm to about 200 nm in some embodiments. In some embodiments, the sacrificial gate electrode layer 30 is subjected to a planarization operation. The sacrificial gate dielectric layer 25 and the sacrificial gate electrode layer 30 are deposited using CVD, including LPCVD and PECVD, PVD, ALD, or other suitable process. Subsequently, a mask layer (not shown) is formed over the sacrificial gate electrode layer 30. The mask layer includes a pad silicon nitride layer and a silicon oxide mask layer in some embodiments.

Next, a patterning operation is performed on the mask layer, and a sacrificial gate dielectric layer 25 and sacrificial gate electrode layer 30 are formed, as shown in FIGS. 4A and 4B. The sacrificial gate dielectric layer 25 and sacrificial gate electrode layer 30 extend in direction substantially perpendicular to the direction in which the fins 15 extend. In some embodiments, as shown in FIG. 4B, the sacrificial gate dielectric layer 25 is removed from the fins 15 where not covered by the sacrificial gate electrode 30, and in other embodiments, the sacrificial gate dielectric layer 25 is not removed from the fins 15.

In FIGS. 4A and 4B, two sacrificial gate structures 52 are formed, but the number of the sacrificial gate structures is not limited to two. One sacrificial gate structure 52 or more than two sacrificial gate structures are formed in some embodiments. In certain embodiments, one or more dummy sacrificial gate structures are formed on both sides of the sacrificial gate structures to improve pattern fidelity.

Figure 5:
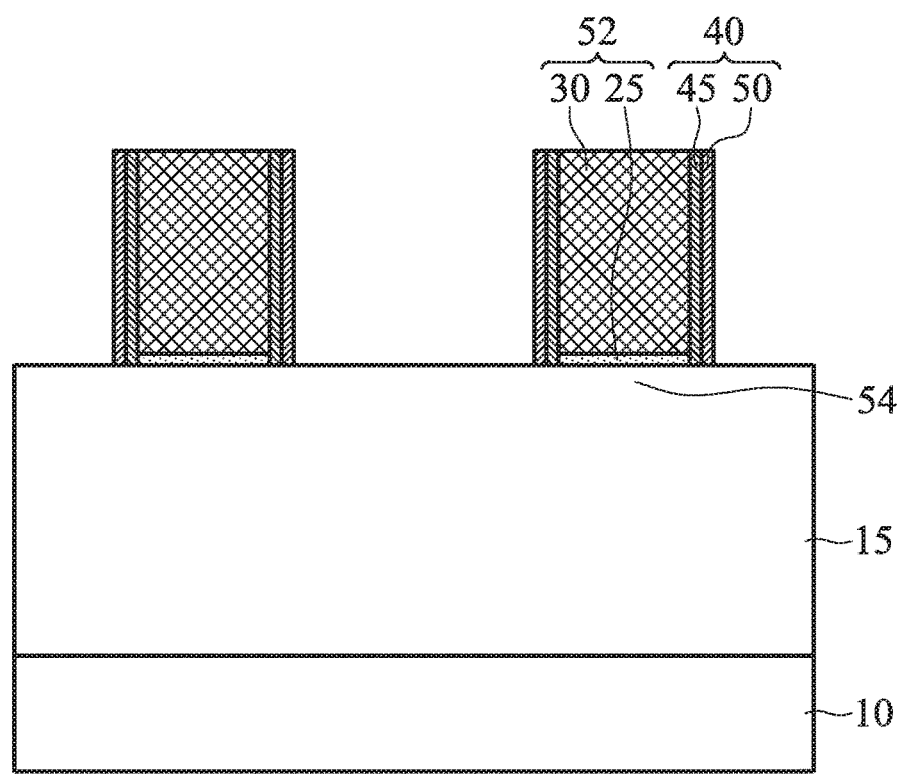
FIG. 5 is a cross sectional view of a stage of a sequential process for manufacturing a semiconductor device according to an embodiment of the present disclosure.

As shown in FIG. 5, insulating gate sidewall spacers 40 are formed on opposing side surfaces of the sacrificial gate dielectric layer 25 and sacrificial gate electrode layer 30 in embodiments of the disclosure. The insulating gate sidewall spacers 40 are about 0.5 nm to about 50 nm thick layers of silicon nitride, silicon oxynitride, silicon carbide, SiON, SiCON, or SiOC. The sidewall spacers 40 are formed by chemical vapor deposition, atomic layer deposition, or any suitable method. In some embodiments, the gate sidewall spacers 40 are formed by conformally depositing the sidewall spacer material on the sacrificial gate electrode layer 30 and sacrificial dielectric layer 25 and then anisotropically etching to remove the sidewall spacer material from the top of the sacrificial gate electrode layer 30 and from between a region between adjacent sacrificial gate electrode layers 30, leaving the remaining gate sidewall spacer material on the sidewalls of the sacrificial gate electrode layer 30.

In some embodiments, the gate sidewall spacers 40 include first and second insulating sidewall spacer layers 45, 50 formed of different materials. For example, in some embodiments, the first sidewall spacer layer 45 is a silicon oxide and the second sidewall spacer layer 50 is a silicon nitride. In some embodiments, the first sidewall spacer layer 45 includes an ONO film having a silicon nitride layer sandwiched by two silicon oxide layers (not shown). The thicknesses of the individual silicon oxide and silicon nitride layers are in a range of about 1 nm to about 30 nm.

Figure 6:
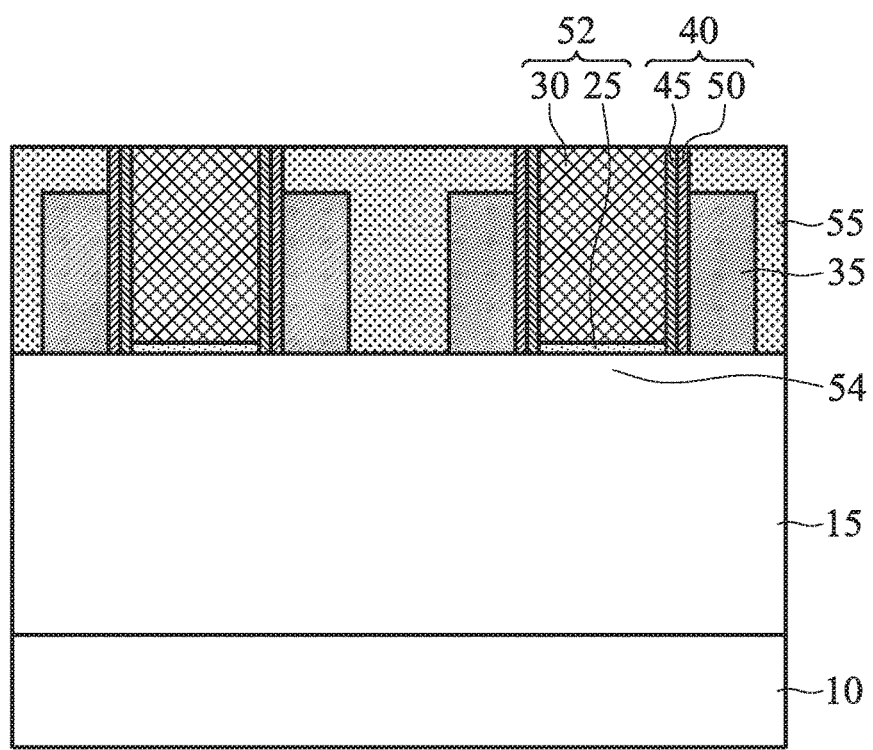
FIG. 6 is a cross sectional view of a stage of a sequential process for manufacturing a semiconductor device according to an embodiment of the present disclosure.

Subsequently, source/drain regions 35 are formed on the fins 15 along the gate sidewall spacers 40 on opposing sides of the gate electrode structures 52, as shown in FIG. 6. In this disclosure, a source and a drain are interchangeably used and the structures thereof are substantially the same. The source/drain region 35 includes one or more layers of Si, SiP, SiC and SiCP for an n-channel FET or Si, SiGe, Ge for a p-channel FET. The source/drain regions 35 are formed by an epitaxial growth method using CVD, ALD, or molecular beam epitaxy (MBE). In some embodiments, the fins 15 at source/drain regions are recessed, for example, below the upper surface of the isolation insulating layer 20, and then source/drain epitaxial layers are formed.

In some embodiments, a dopant is implanted into the source/drain regions 35. In some embodiments, the dopant is one or more selected from the group consisting of boron, aluminum, gallium, phosphorus, arsenic, and antimony. The concentration of dopant in the source/drain region ranges from about $1\times10^{17}$ atoms/cm$^3$ to about $1\times10^{21}$ atoms/cm$^3$ in some embodiments.

Subsequently, an interlayer dielectric (ILD) layer 55 is formed, as shown in FIG. 6. The interlayer dielectric layer 55 is an insulating layer made of an insulating material. The materials for the ILD layer 55 include compounds comprising Si, O, C, and/or H, such as silicon oxide, SiCOH, and SiOC in some embodiments. In some embodiments, the ILD layer 55 is one or more layers of silicon oxide, silicon nitride, a low-k dielectric material, or a combination thereof. Organic materials, such as polymers, may be used for the ILD layer 55. The interlayer dielectric layer 55 can be formed by chemical vapor deposition. After the ILD layer 55 is formed, a planarization operation, such as chemical-mechanical polishing (CMP), is performed, so that the top portion of the sacrificial gate electrode layer 30 is exposed.

In the semiconductor device fabrication operations shown in FIGS. 7-17, two spaced-apart regions are illustrated. For example, a ring oscillator device includes a core (or logic) devices in a core region and input-output (IO) devices in an IO region. In some embodiments, the first region 65 is the core region, and the second region 70 is IO region 70 of the semiconductor device.

Figure 7:
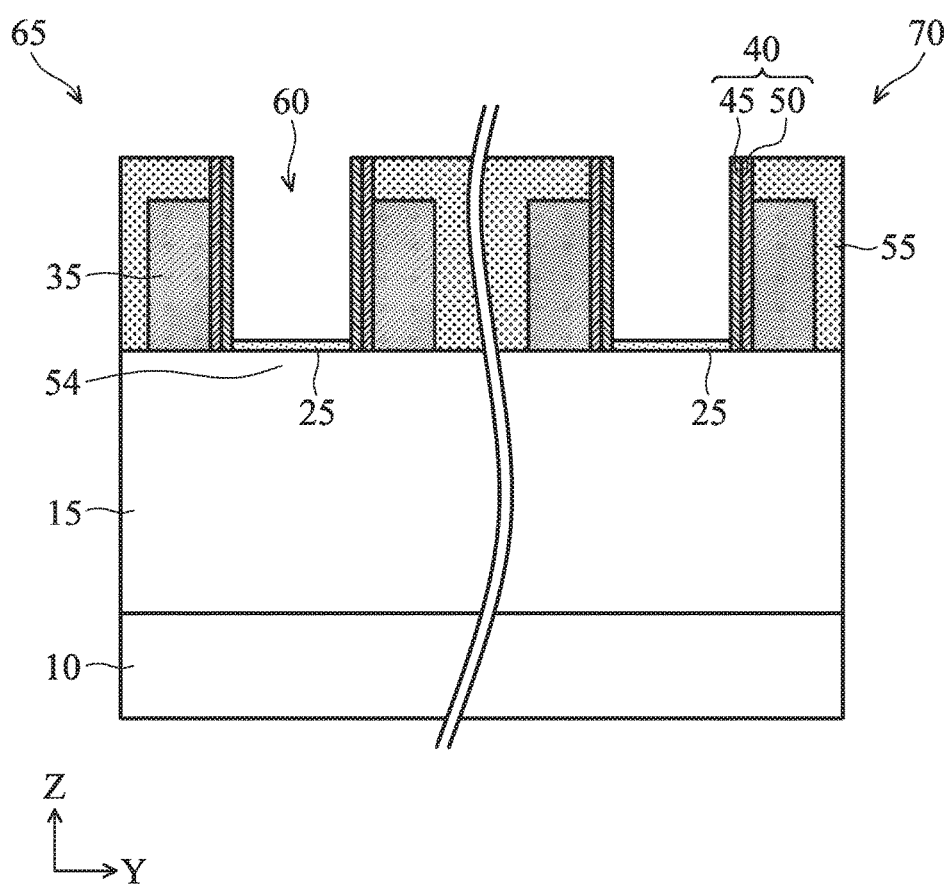
FIG. 7 is a cross sectional view of a stage of a sequential process for manufacturing a semiconductor device according to an embodiment of the present disclosure.

As shown in FIG. 7, the sacrificial gate electrode layers 30 are removed to form gate spaces 60. The gate electrode layers 30 are removed by an etching technique using an etchant that is selective to the gate electrode layer 30 and not the gate sidewall spacer 40 and sacrificial gate dielectric layer 25. In some embodiments, tetramethyl ammonium hydroxide (TMAH) is used as the etchant.

Figure 8:
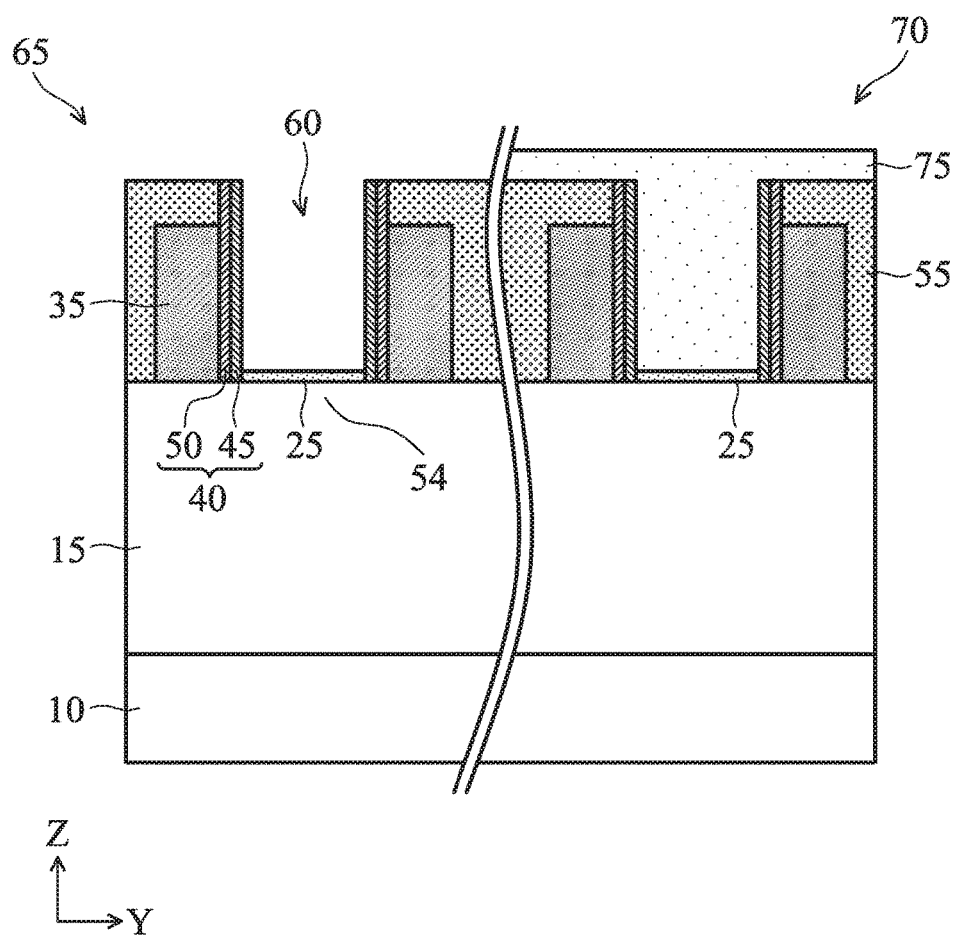
FIG. 8 is a cross sectional view of a stage of a sequential process for manufacturing a semiconductor device according to an embodiment of the present disclosure.

Next, the IO region 70 is masked, as shown in FIG. 8. The mask 75 is a photoresist in some embodiments. The mask can be formed by depositing a photoresist over the semiconductor device, selectively exposing the photoresist to actinic radiation, such as ultraviolet light in some embodiments, and developing the selectively exposed photoresist. The photoresist can be a positive photoresist or a negative photoresist. When the photoresist is a positive resist, the portion of the photoresist exposed to the actinic radiation becomes soluble in the developer and is removed during the development operation. When the photoresist is a negative photoresist, the portion photoresist exposed to actinic radiation becomes insoluble in the developer and remains on the device, while the portion not exposed to the actinic radiation is removed, during the development operation.

Figure 9:
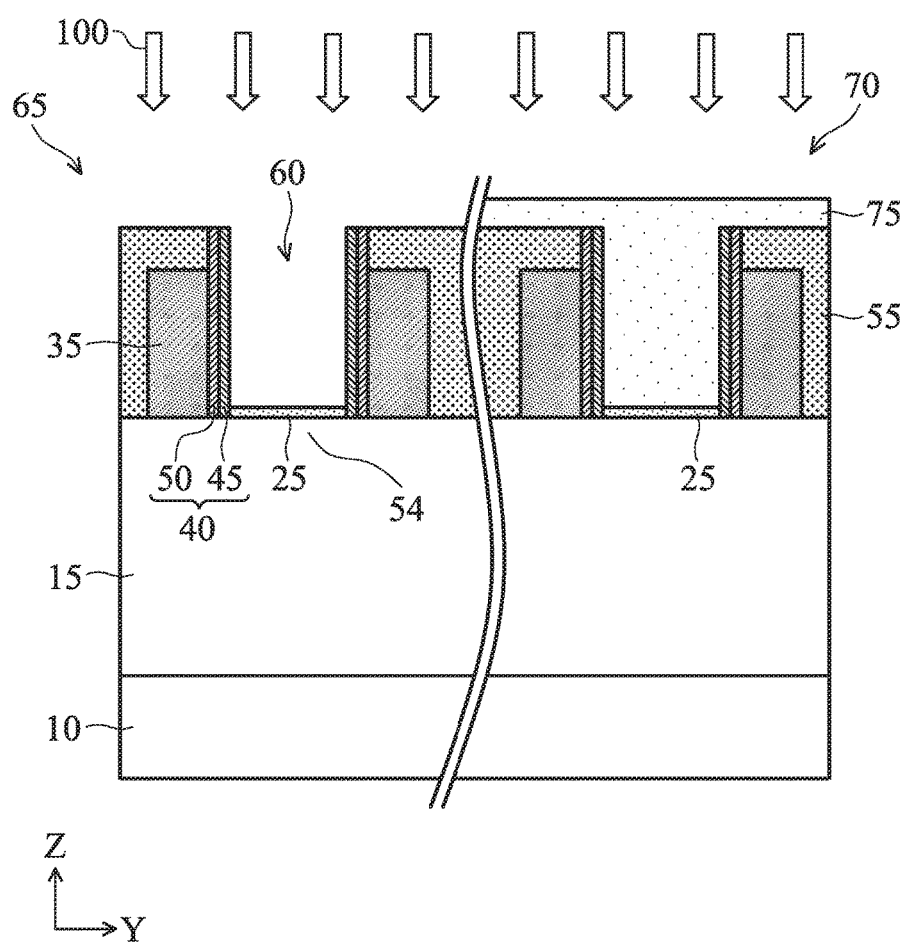
FIG. 9 is a cross sectional view of a stage of a sequential process for manufacturing a semiconductor device according to an embodiment of the present disclosure.

Fluorine is then implanted into the core region, including the gate sidewall spacers 40, as shown in FIG. 9. In some embodiments, a first fluorine implantation 100 is performed at an energy ranging from about 50 eV to about 500 eV, and a dose ranging from about $1\times10^{13}$ atoms/cm$^2$ to about $1\times10^{16}$ atoms/cm$^2$. In some embodiments, the first fluorine implantation dose ranges from about $1\times10^{14}$ atoms/cm$^2$ to about $1\times10^{15}$ atoms/cm$^2$. In a certain embodiment, the fluorine implantation is performed at an energy of about 200 eV to about 400 eV at a dose of about $5\times10^{14}$ atoms/cm$^2$ to about $1\times10^{15}$ atoms/cm$^2$ at tilt angle of about 0° to about 20° with respect to the normal direction (Z) of the substrate 10, and a twist angle of about 0° to about 90°.

Ion implantation operations to a high-aspect ratio structure, such as gate spaces, face some problems such as a shadowing effect. Due to the shadowing effect, ions may not implant into the gate spaces uniformly. To solve this problem, a multiple angle implantation process is employed. By using smaller tilt angles with respect to the normal direction perpendicular to the surface of the substrate (Z direction), it is possible to implant ions into the top of the fins, while by using larger tilt angles with respect to the normal direction, it is possible to implant ions into sidewalls of the gate structures. Ion implantation at different tilt angles and twist angles provides improved ion implantation into the fins and gate sidewall spacers.

The angle of the tilted ion implantation is defined as an acute angle (smaller angle) made by the normal direction (the Z direction) of a main surface of the substrate and an ion beam direction in the ZY plane made by the Z direction and the Y direction. If the angle is zero, the direction of the ion beam is substantially parallel to the normal direction of the substrate.

The ion implantation at a tilt angle greater than 0 degrees is performed twice to implant ions into one of the side surface of the sidewall spacer structure 40 (e.g., the right side in FIG. 9) and the other side surface of the sidewall spacer structure 20 (e.g., the left side in FIG. 9), for example, by rotating the substrate (wafer) 180 degrees around its center axis.

Figure 10:
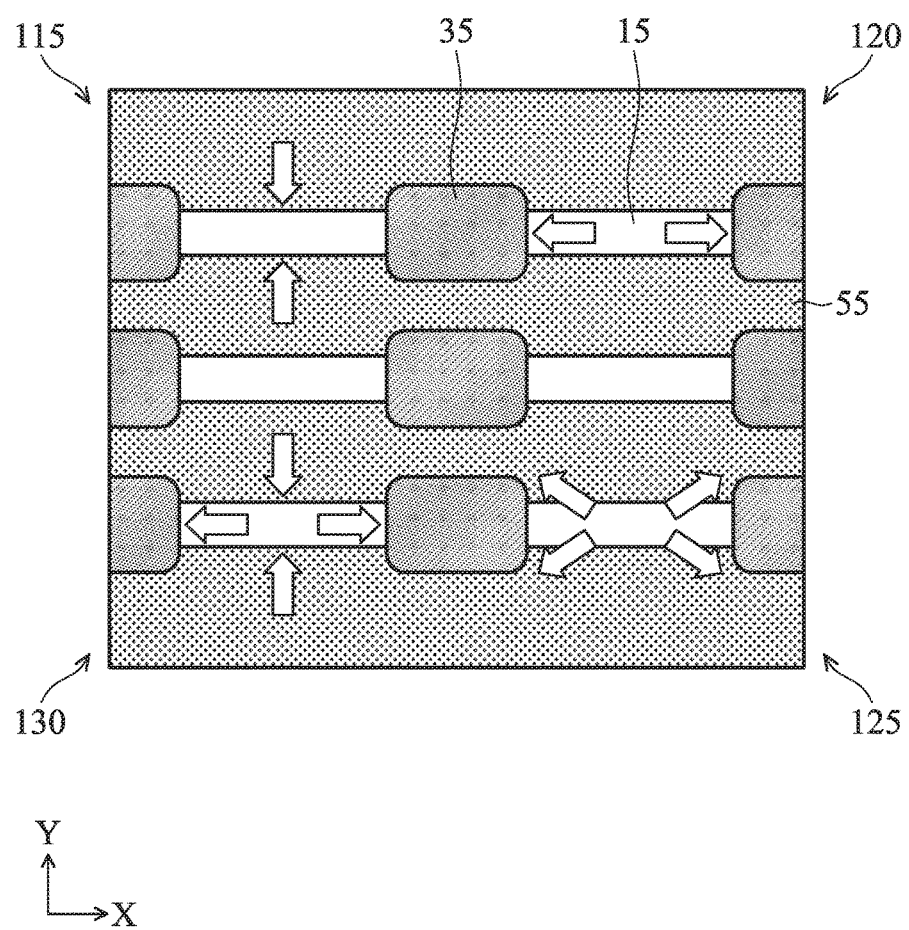
FIG. 10 is a plan view of various implantation operations according to embodiments of the present disclosure.

FIG. 10 is a plan view of various implantation operations according to embodiments of the present disclosure. As shown in the upper left portion 115 of FIG. 10, a bi-mode implant with 0° twist angle is performed. In the bi-mode implant a first implant is performed and then the substrate is rotated 180° and then a second implant is performed. In the upper right portion 120, a bi-mode implant with a twist angle of 90° is illustrated. The twist angle is the amount the substrate is rotated the within the substrate plane. A bi-mode implant with 90° twist angle includes an implantation after rotating the 90° in the substrate plane, followed by a second implant after rotating the substrate an additional 180°. In a quad-mode implant, there are four implantations, each implantation being performed after the substrate is rotated by an increment of 90°. The lower right portion 125 illustrates a quad-mode implant with a twist angle of 45°. A quad-mode implant with 0° twist angle is illustrated in the lower left portion 130. This disclosure is not limited to the specifically disclosed embodiments, and other suitable combinations of twist angles and tilt angles are included in the present disclosure.

Figure 11:
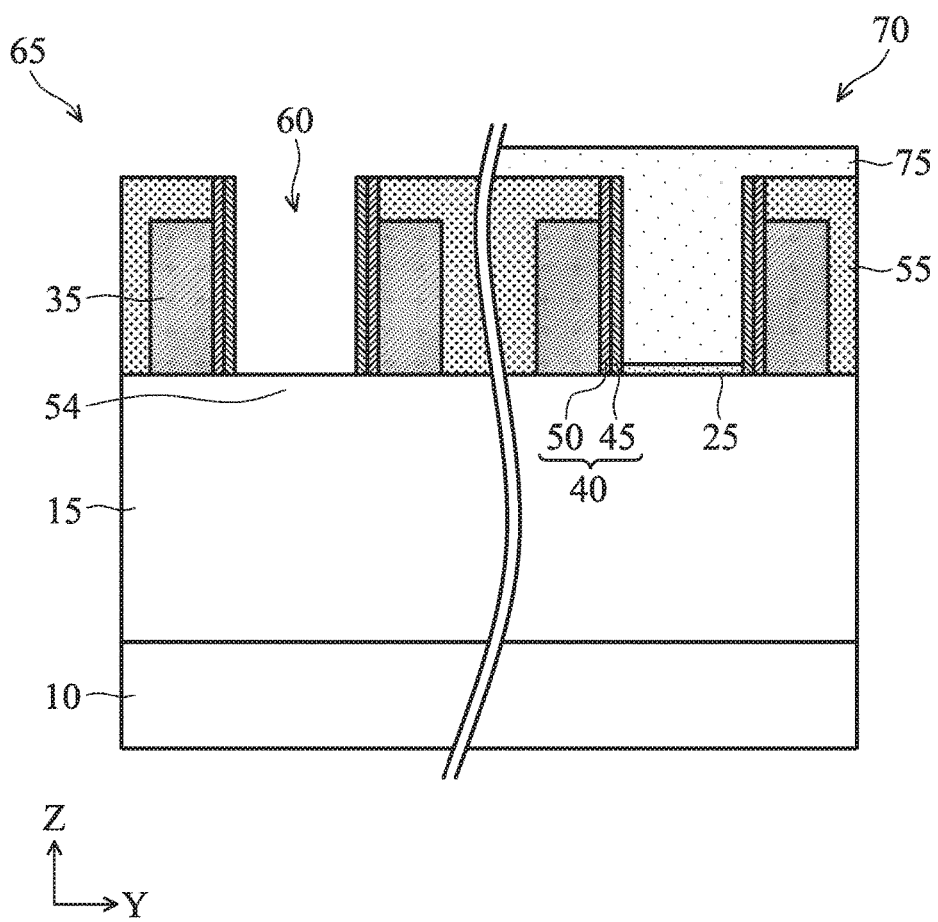
FIG. 11 is a cross sectional view of a stage of a sequential process for manufacturing a semiconductor device according to an embodiment of the present disclosure.

After the first fluorine implantation, the core region sacrificial gate dielectric 25 layer is removed, as shown in FIG. 11. The sacrificial gate dielectric layer 25 is removed by a suitable wet or dry etching operation. In some embodiments, where the first gate sidewall spacer layer 45 is formed of a different material than the sacrificial gate dielectric layer 25, the sacrificial gate dielectric layer 25 is removed using a suitable wet etchant, such as an HF based solution. In other embodiments, the sacrificial gate dielectric layer 25 is removed by an anisotropic plasma etching operation.

Figure 12:
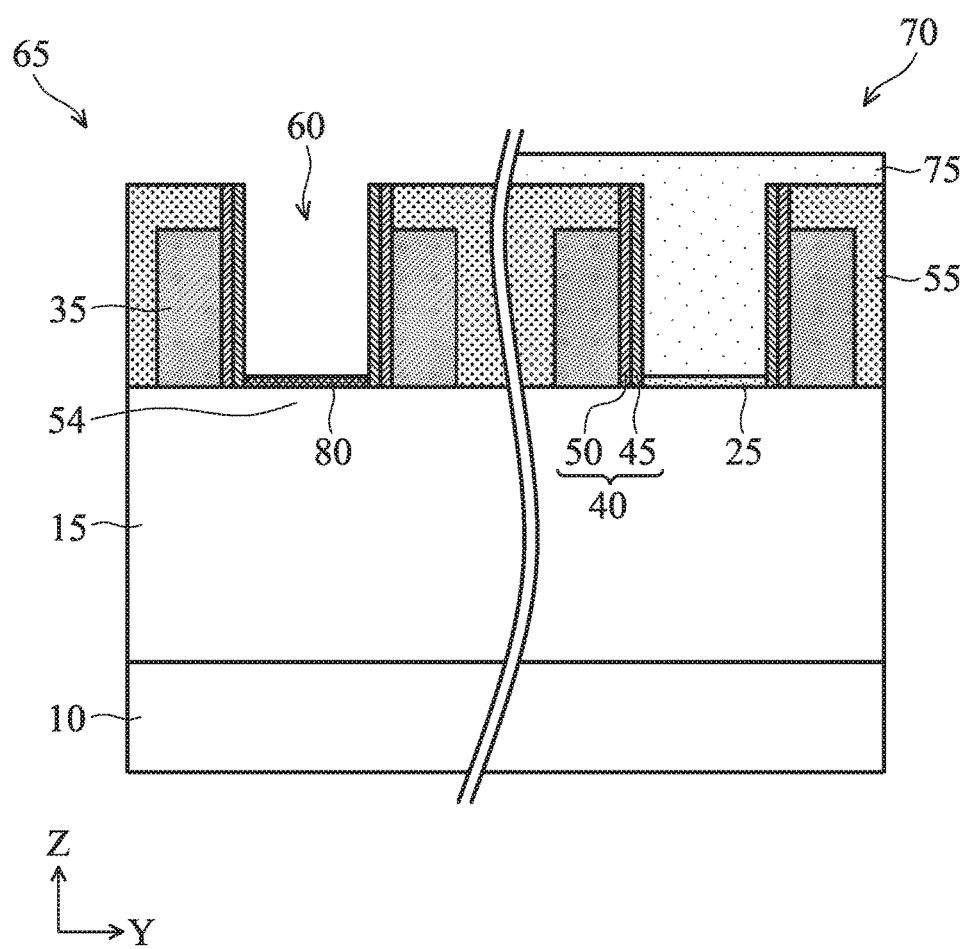
FIG. 12 is a cross sectional view of a stage of a sequential process for manufacturing a semiconductor device according to an embodiment of the present disclosure.

An interfacial layer 80, such as an oxide layer, is subsequently grown on the fin 15 in the gate space 60 of the core region 65 by a chemical oxidation process, as shown in FIG. 12. In some embodiments, the interfacial layer is a silicon oxide layer formed using deionized water+ozone (DIO$_3$), NH$_4$OH+H$_2$O$_2$+H$_2$O (APM), or other methods. In some embodiments, the thickness of the interfacial layer 80 is less than the thickness of the sacrificial gate dielectric layer 25.

Figure 13:
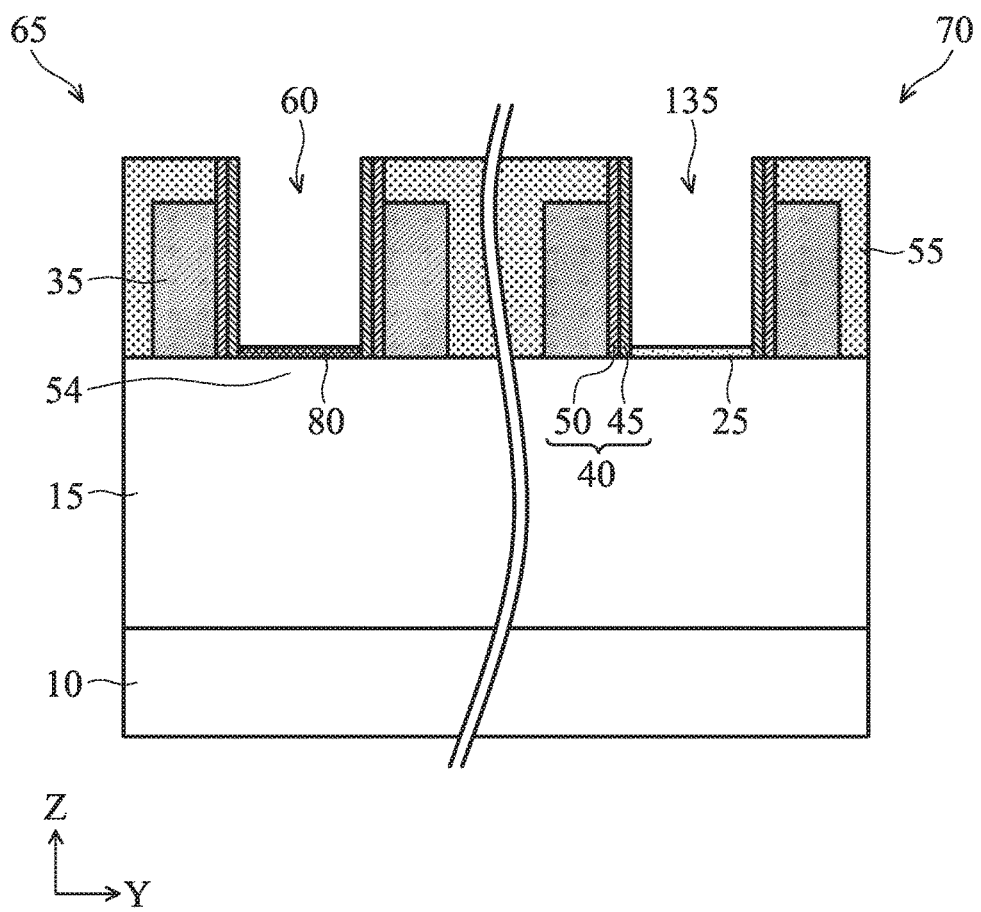
FIG. 13 is a cross sectional view of a stage of a sequential process for manufacturing a semiconductor device according to an embodiment of the present disclosure.

Next, the mask 75 is removed from the second region 70 in some embodiments to form a second gate space 135, as shown in FIG. 13. The mask is removed using a suitable photoresist stripper or by plasma ashing in some embodiments. In some embodiments, the sacrificial gate dielectric layer 25 in the second gate space 135 is removed using suitable etching techniques.

Figure 14:
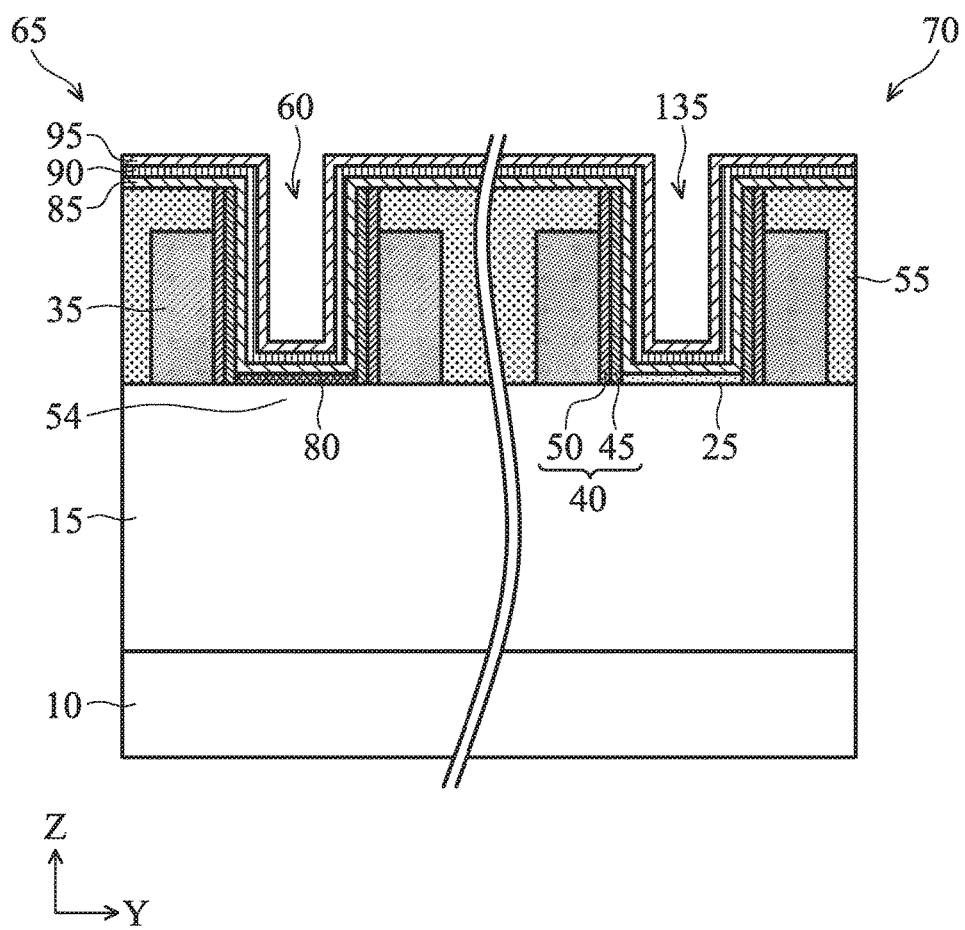
FIG. 14 is a cross sectional view of a stage of a sequential process for manufacturing a semiconductor device according to an embodiment of the present disclosure.

A high-k gate dielectric layer 85 is subsequently formed over the interfacial layer 80, along the sidewalls of the gate space 60 in some embodiments, as shown in FIG. 14. The high-k dielectric layer 85 is also formed in the second gate space 135, as shown in FIG. 14 in some embodiments. A conductive barrier layer 90 is then formed on the high-k gate dielectric layer 85. In some embodiments, a capping layer 95 is formed over the barrier layer 90.

The high-k gate dielectric layer 85 includes one or more layers of $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, and other suitable high-k dielectric materials. The high-k gate dielectric layer 85 may be formed by CVD, ALD or any suitable method. In some embodiments, the high-k gate dielectric layer 85 is formed using a highly conformal deposition process such as ALD in order to ensure the formation of a gate dielectric layer having a uniform thickness around each channel region 54. The thickness of the high-k gate dielectric layer 85 is in a range from about 1 nm to about 6 nm in some embodiments.

The conductive barrier layer 90 is a metal nitride layer in some embodiments including one or more layers of TaN, TiN, TiN doped with Si, or any other suitable conductive material. After the barrier layer 90 is formed, an anneal operation (e.g., at a temperature about 700-900° C. in an inert atmosphere) is performed in some embodiments. In a certain embodiment, the thermal anneal is performed at about 800° C. The thickness of the barrier layer 90 is in a range from about 0.5 nm to about 5 nm in some embodiments. The barrier layer 90 may be formed by CVD, ALD or any suitable method.

The capping layer 95 is made of amorphous material, such as amorphous Si, amorphous Ge, or any other suitable material, in some embodiments. The thickness of the capping layer 95 is in a range from about 0.5 nm to about 5 nm in some embodiments. The capping layer 95 may be formed by CVD, ALD or any suitable method.

Figure 15:
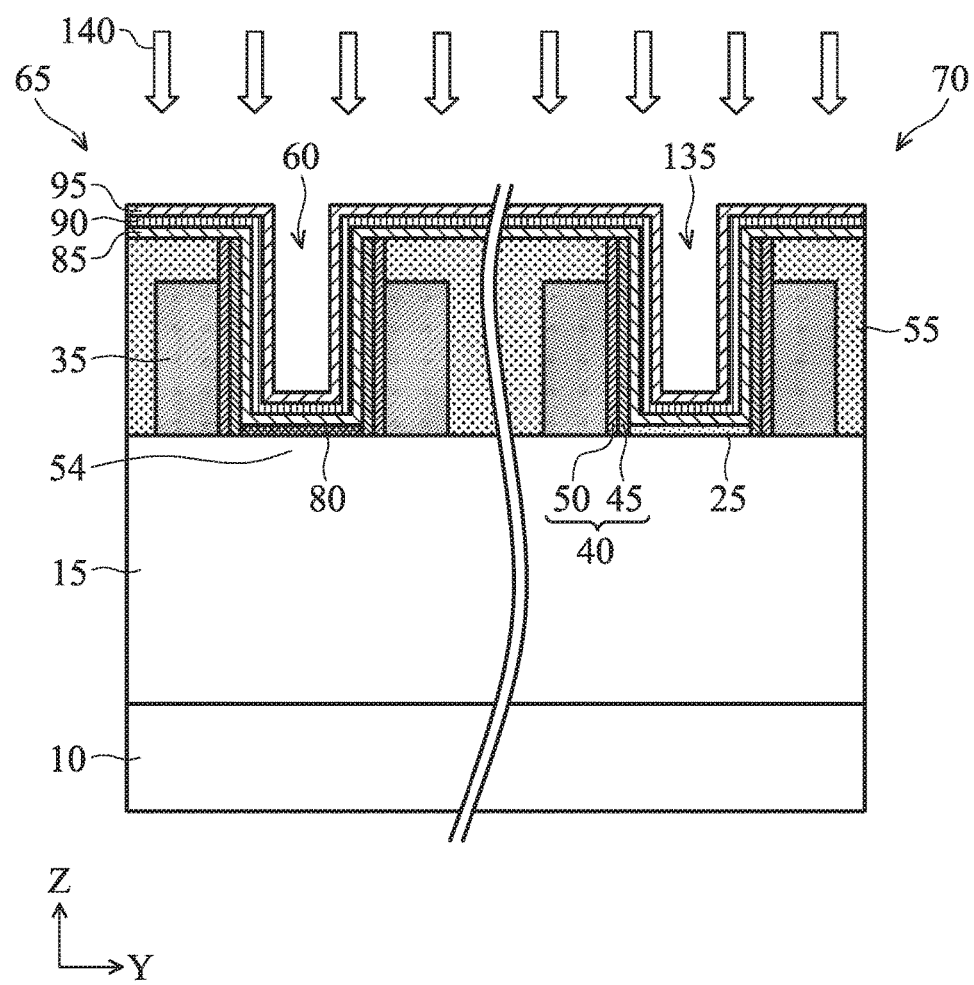
FIG. 15 is a cross sectional view of a stage of a sequential process for manufacturing a semiconductor device according to an embodiment of the present disclosure.

As shown in FIG. 15, a second fluorine implantation 140 is subsequently performed. In some embodiments, the second fluorine implantation is performed at an energy ranging from about 50 eV to about 500 eV, and a dose ranging from about $1\times10^{13}$ atoms/$cm^2$ to about $1\times10^{16}$ atoms/$cm^2$. In some embodiments, the second fluorine implantation dose ranges from about $1\times10^{14}$ atoms/$cm^2$ to about $1\times10^{15}$ atoms/$cm^2$. In a certain embodiment the fluorine implantation is performed at an energy of about 300 eV at a dose of about $8\times10^{14}$ atoms/$cm^2$, at a tilt angle of about 0° to about 20°, and a twist angle of about 0° to about 90°. The fluorine is implanted into the fin 15 and the gate sidewall spacers 40 in some embodiments. The implanted fluorine can reduce defects existing in the interface between the channel (e.g., Si) and the interfacial layer (e.g., oxide) in the first region 65. In some embodiments, fluorine is implanted into the fin 15 and the gate sidewall 40 spacers of the second region 70, as shown in FIG. 15.

To address the problem of shadowing and to ensure the fin 15 and gate sidewall spacers 40 are suitably implanted with ions, a multiple angle implantation process is employed during the second fluorine implantation 140, as discussed herein regarding the first fluorine implantation 100. Multiple ion implantations at different tilt and twist angles are performed as discussed herein.

In some embodiments, the concentration of fluorine implanted into the gate sidewall spacers 40 and channel regions 54 in the first region 65 as a result of the first fluorine implantation 100 and the second fluorine implantation 140 ranges from about 0.25 atomic % to about 15 atomic % based on the total atomic % of the fluorine and gate sidewall spacer material or channel region material, respectively. In some embodiments, the concentration of fluorine implanted into the gate sidewall spacers ranges from about 1 atomic % to about 10 atomic % based on the total atomic % of the fluorine and gate sidewall spacer material or channel region material, respectively. In some embodiments, the concentration of fluorine implanted into the gate sidewall spacers ranges from about 3 atomic % to about 7 atomic % based on the total atomic % of the fluorine and gate sidewall spacer material or channel region material, respectively.

After the second fluorine implantation, the device is subjected to a post capping anneal in some embodiments. In some embodiments, the post capping anneal is performed at about 800° C. to about 1000° C. in an inert atmosphere. In a certain embodiment, the post capping anneal is performed at about 900° C.

Figure 16:
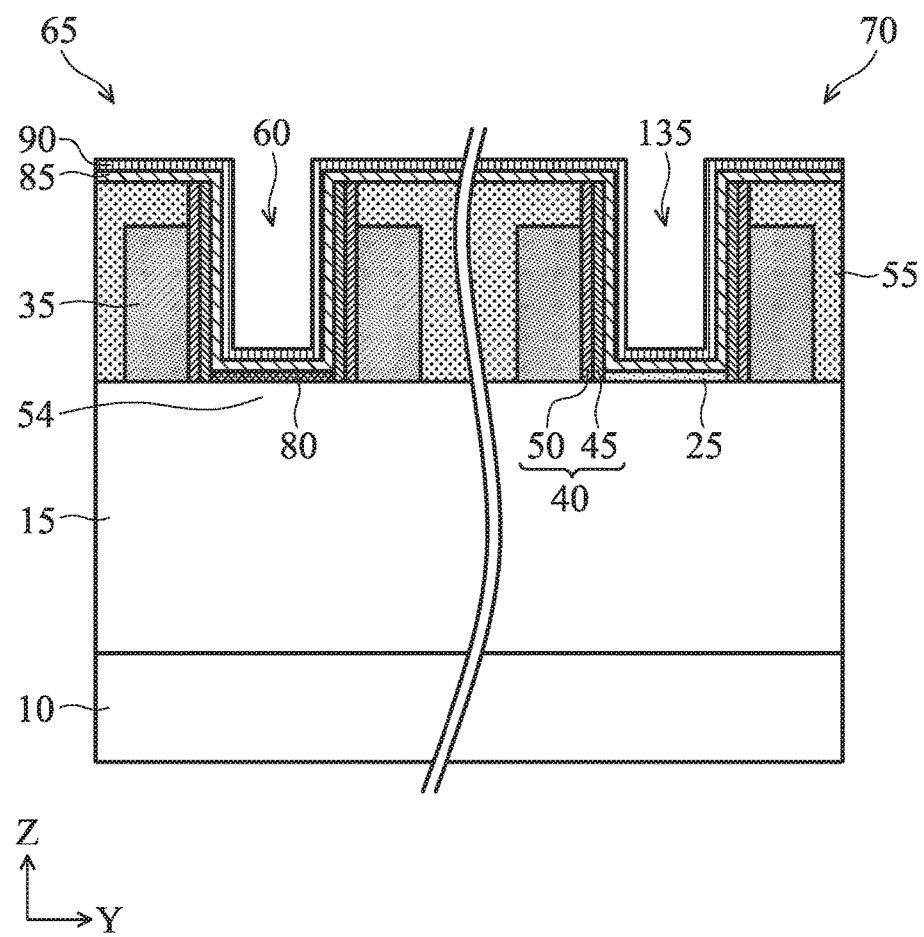
FIG. 16 is a cross sectional view of a stage of a sequential process for manufacturing a semiconductor device according to an embodiment of the present disclosure.

Next, the capping layer 95 is removed, as shown in FIG. 16. The capping layer 95 is removed using suitable etching and lithography techniques. In some embodiments, a post capping anneal is performed at about 800° C. to about 1000° C. in an inert atmosphere after removal of the capping layer.

Figure 17:
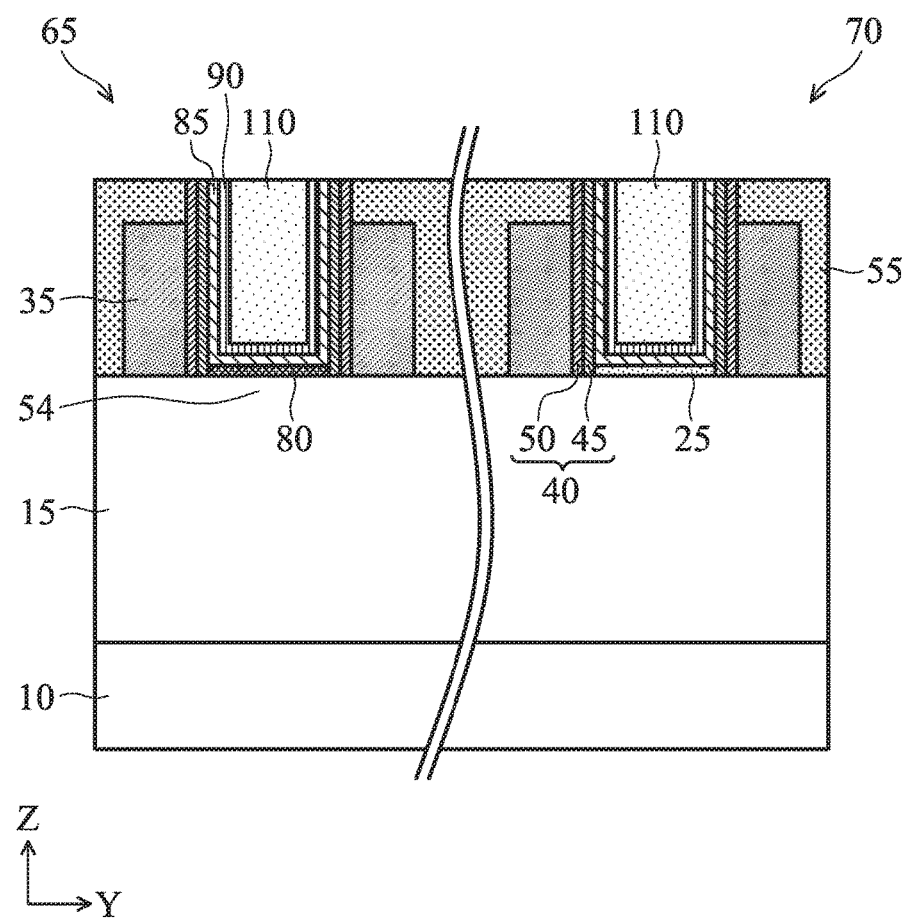
FIG. 17 is a cross sectional view of a stage of a sequential process for manufacturing a semiconductor device according to an embodiment of the present disclosure.

Then, one or more conductive layers are formed over the barrier layer 90 in the core region 65 and in the IO region 70, thereby forming metal gate electrodes 110, as shown in FIG. 17.

In some embodiments, the metal gate electrodes 110 include one or more work function adjustment layers (not shown) formed over the barrier layer 90 and a main metal layer 110 formed over the work function adjustment layers. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi are used as the work function adjustment layer, and for the p-channel FinFET, one or more of TiAlC, Al, TiAl, TaN, TaAlC, TiN, TiC and Co is used as the work function adjustment layer.

In some embodiments, the main metal layer of the metal gate electrode 110 includes a metallic material selected from the group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the main metal layer 110 includes a metal selected from a group consisting of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. The work function adjustment layer and the main metal layer may be formed using a suitable process such as atomic layer deposition (ALD), chemical vapor deposition (CVD), physical vapor deposition (PVD), plating, or combinations thereof.

In some embodiments, after forming the main metal layer, excess metal is removed from the upper surface of the interlayer dielectric layer 55 by a suitable polishing process, such as CMP, or an etch-back operation, to form the structure as shown in FIG. 17.

After forming the gate electrodes 110, further CMOS processes are performed to form various features such as additional interlayer dielectric layers, contacts/vias, interconnect metal layers, and passivation layers, etc. The foregoing first and second fluorine ion implantation operations can be applied to both n-type FinFETs and p-type FinFETs.

Figure 18:
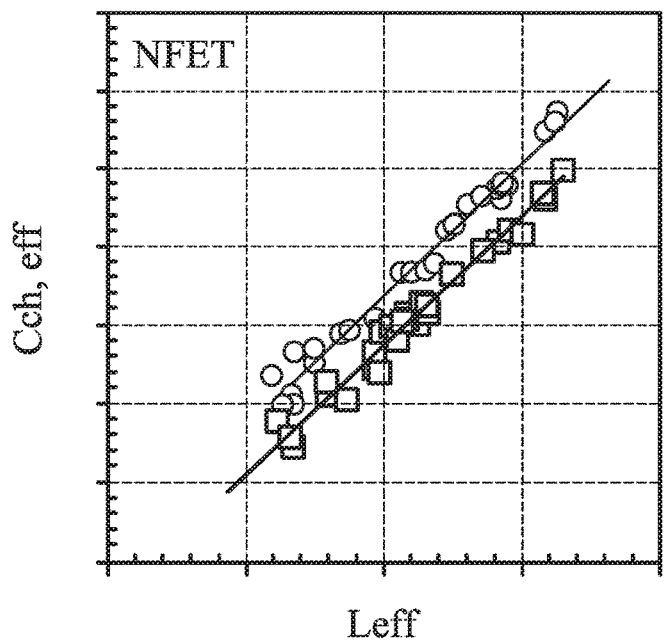
FIG. 18 is a graph showing the effective channel length versus effective channel capacitance for an NFET according to an embodiment of the present disclosure.

FIG. 18 is a graph showing the effective channel length (Leff) versus effective channel capacitance (Cch,eff) for an NFET according to an embodiment of the present disclosure. The circles represent the control and the squares represent an embodiment according to the present disclosure. As shown in FIG. 18 NFETs according to the present disclosure have decreased channel capacitance at a fixed effective channel length.

Figure 19:
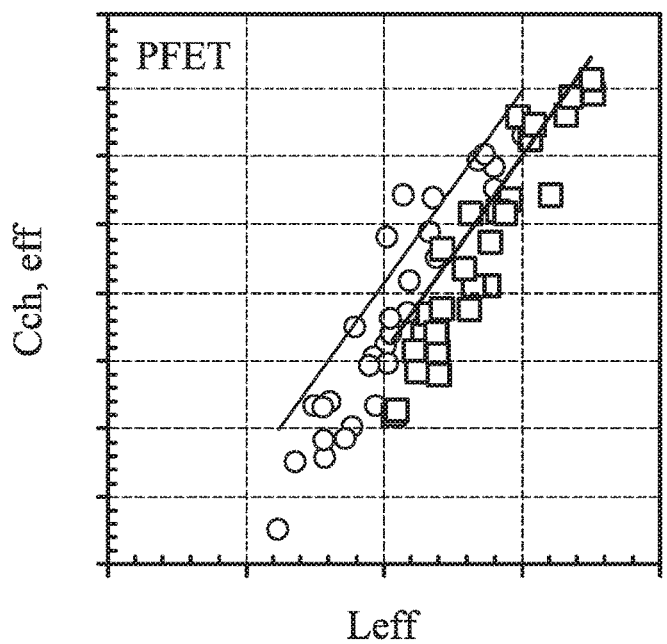
FIG. 19 is a graph showing the effective channel length versus effective channel capacitance for a PFET device according to an embodiment of the present disclosure.

FIG. 19 is a graph showing the effective channel length (Leff) versus effective channel capacitance (Cch,eff) for a PFET device according to an embodiment of the present disclosure. The circles represent the control and the squares represent an embodiment according to the present disclosure. As shown in FIG. 19, PFETs according to the present disclosure have decreased channel capacitance and increased effective channel length.

Semiconductor devices, such as ring oscillators, formed according to the present disclosure have shown up to 1.5% overall improvement in operating parameters, such as effective capacitance, in some embodiments. Some embodiments show up to 3.5% decrease in effective capacitance. However, in some embodiments, the 3.5% decrease in capacitance is offset by 2% loss in performance due to an increase in the gate oxide thickness, because of the combined thickness of the interfacial layer and the high-k gate dielectric layer. Semiconductor devices fabricated according to the present disclosure also provide improved product yield.

An embodiment of the present disclosure is a method for fabricating a semiconductor device, including forming a fin extending along a first direction on a semiconductor substrate, and forming a sacrificial gate electrode structure extending along a second direction substantially perpendicular to the first direction over the fin. The sacrificial gate electrode structure includes a sacrificial gate dielectric layer and a sacrificial gate electrode layer disposed over the sacrificial gate dielectric layer. Opposing gate sidewall spacers are formed, extending along the second direction, on opposing sides of the sacrificial gate electrode layer. The sacrificial gate electrode layer is removed to form a gate space. Fluorine is implanted into the gate sidewall spacers after removing the gate electrode layer by performing a first fluorine implantation. The sacrificial gate dielectric layer is removed. A high-k gate dielectric layer is formed in the gate space, and fluorine is implanted into the gate sidewall spacers and the fin after forming the high-k gate dielectric layer by performing a second fluorine implantation. In an embodiment, the first fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, the second fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, the method includes forming an interfacial oxide layer on the fin in the gate space after removing the sacrificial gate dielectric layer and before forming the high-k gate dielectric layer. In an embodiment, the method includes forming a metal nitride layer over the high-k gate dielectric layer. In an embodiment, the method includes performing an annealing operation after forming the metal nitride layer. In an embodiment, the method includes forming a silicon capping layer over the metal nitride layer. In an embodiment, the method includes performing an annealing operation after forming the silicon capping layer.

An embodiment of the present disclosure is a method for fabricating a semiconductor device, including forming a plurality of fins extending along a first direction on a semiconductor substrate. The semiconductor substrate includes a first region and a second region, and the plurality of fins are formed on the first and second regions of the semiconductor substrate. A plurality of sacrificial gate electrode structures is formed extending along a second direction substantially perpendicular to the first direction over the fins. The sacrificial gate electrode structures each include a sacrificial gate dielectric layer and a sacrificial gate electrode layer disposed over the sacrificial gate dielectric layer, and opposing gate sidewall spacers, extending along the second direction, formed on opposing sides of the sacrificial gate electrode layer. The sacrificial gate electrode layers are removed from the plurality of gate electrode structures to form gate spaces. The first region is masked and fluorine is implanted into the gate sidewall spacers and the fins in the second region after removing the gate electrode layer by performing a first fluorine implantation. The sacrificial gate dielectric layers in the second region are removed. High-k gate dielectric layers are formed in the gate spaces in the second region, and fluorine is implanted into the gate sidewall spacers and the fins in the second region after forming the high-k gate dielectric layers by performing a second fluorine implantation. In an embodiment, the first region is an input/output (I/O) region of the semiconductor device, and the second region is a core region of the semiconductor device. In an embodiment, the first fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, the second fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, the method further includes forming an interfacial oxide layer in the gate spaces by a chemical oxidation process after removing the sacrificial gate dielectric layer and before forming the high-k gate dielectric layer. In an embodiment, the method includes forming a metal nitride layer over the high-k gate dielectric layer. In an embodiment, the metal nitride layer is a TiN layer. In an embodiment, the method includes forming a silicon capping layer over the metal nitride layer.

An embodiment of the present disclosure is a method for reducing the dielectric constant of gate sidewall spacers of a semiconductor device, including implanting fluorine into a pair of adjacent gate sidewall spacers of the semiconductor device by performing a first fluorine implantation. A high-k gate dielectric layer is formed between the pair of adjacent gate sidewall spacers. A barrier layer is formed on the high-k gate dielectric layer, and fluorine is implanted into the gate sidewall spacers and a channel region of the semiconductor device after forming the barrier layer by performing a second fluorine implantation. In an embodiment, the first fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, the second fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, before performing the second fluorine implantation, the method includes: forming an interfacial oxide layer between the pair of adjacent gate sidewall spacers by a chemical oxidation process before forming the high-k gate dielectric layer; forming the barrier layer over the high-k gate dielectric layer; and forming a silicon capping layer over the barrier layer.

An embodiment of the disclosure is a method for reducing the dielectric constant of gate sidewall spacers of a semiconductor device, including forming a sacrificial gate electrode structure extending along a first direction over a fin extending along a second direction substantially perpendicular to the first direction on a semiconductor substrate. The sacrificial gate electrode structure includes a sacrificial gate dielectric layer and a sacrificial gate electrode layer disposed over the sacrificial gate dielectric layer. Opposing gate sidewall spacers are formed, extending along the second direction, on opposing sides of the sacrificial gate electrode layer. The sacrificial gate electrode layer is removed to form a gate space, and fluorine is implanted into the gate sidewall spacers and a channel region of the semiconductor device after removing the gate electrode layer by performing a first fluorine implantation. The sacrificial gate dielectric layer is removed, and a high-k gate dielectric layer is formed in the gate space. Fluorine is implanted into the gate sidewall spacers and the channel region of the semiconductor device after forming the metal nitride layer by performing a second fluorine implantation. In an embodiment, the first fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, the second fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, the method includes forming an interfacial oxide layer in the gate space by a chemical oxidation process after removing the sacrificial gate dielectric layer and before forming the high-k gate dielectric layer. In an embodiment, the method includes forming a metal nitride layer over the high-k gate dielectric layer. In an embodiment, the method includes performing a thermal annealing operation at a temperature of about 700° C. to about 900° C. after forming the metal nitride layer. In an embodiment, the method includes forming a silicon capping layer over the metal nitride layer. In an embodiment, the method includes performing a thermal annealing operation at a temperature of about 800° C. to about 1000° C. after forming the silicon capping layer.

An embodiment of the present disclosure is a method of retarding dopant diffusion into a channel region of a semiconductor device, including implanting fluorine into a pair of adjacent gate sidewall spacers of a field effect transistor by performing a first fluorine implantation. An interfacial oxide layer is formed between the pair of adjacent gate sidewall spacers. A high-k gate dielectric layer on the interfacial oxide layer, and fluorine is implanted into the gate sidewall spacers and a channel region of the field effect transistor after forming the high-k gate dielectric layer by performing a second fluorine implantation. In an embodiment, the first fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, the second fluorine implantation is performed at an energy ranging from 50 eV to 500 eV, and a dose ranging from $1\times10^{13}$ atoms/cm$^2$ to $1\times10^{16}$ atoms/cm$^2$. In an embodiment the method includes forming a metal nitride layer over the high-k gate dielectric layer. In an embodiment, the method includes performing a thermal annealing operation at a temperature of 700° C. to 900° C. after forming the metal nitride layer. In an embodiment, the method includes forming a silicon capping layer over the metal nitride layer. In an embodiment, the method includes performing a thermal annealing operation at a temperature of 800° C. to 1000° C. after forming the silicon capping layer.

An embodiment of the present disclosure is a method of retarding dopant diffusion into a channel region of a semiconductor device, including forming a sacrificial gate electrode structure extending along a first direction over a fin extending along a second direction substantially perpendicular to the first direction on a semiconductor substrate. The sacrificial gate electrode structure includes a sacrificial gate dielectric layer and a sacrificial gate electrode layer disposed over the sacrificial gate dielectric layer. Opposing gate sidewall spacers are formed, extending along the second direction, on opposing sides of the sacrificial gate electrode layer. The sacrificial gate electrode layer is removed to form a gate space. Fluorine is implanted into the gate sidewall spacers after removing the gate electrode layer by performing a first fluorine implantation. The sacrificial gate dielectric layer is removed, and a high-k gate dielectric layer is formed in the gate space. A barrier layer is formed over the high-k gate dielectric layer, and a capping layer is formed over the barrier layer. Fluorine is implanted into the gate sidewall spacers and a channel region of the semiconductor device after forming the capping layer by performing a second fluorine implantation. In an embodiment, the first fluorine implantation is performed at an energy ranging from 50 eV to 500 eV, and a dose ranging from $1\times10^{13}$ atoms/cm$^2$ to $1\times10^{16}$ atoms/cm$^2$. In an embodiment, the method includes forming an interfacial oxide layer in the gate space by a chemical oxidation process after removing the sacrificial gate dielectric layer and before forming the high-k gate dielectric layer. In an embodiment, the method includes performing a thermal annealing operation layer at a temperature of 700° C. to 900° C. after forming the barrier layer. In an embodiment, the method includes performing a thermal annealing operation at a temperature of 800° C. to 1000° C. before performing the second fluorine implantation.

An embodiment of the present disclosure is a semiconductor device including a fin extending along a first direction on a semiconductor substrate, and a gate electrode structure extending along a second direction substantially perpendicular to the first direction over the fin. The gate electrode structure includes a gate dielectric layer and a gate electrode layer disposed over the gate dielectric layer. Opposing gate sidewall spacers extend along the second direction on opposing sides of the gate electrode layer. The gate sidewall spacers include 0.25 atomic % to 15 atomic % of fluorine based on a total amount of fluorine and gate sidewall spacer material. In an embodiment, the gate electrode structure is disposed over a channel region of the fin, and the channel region of the fin includes 0.25 atomic % to 15 atomic % of fluorine based on a total amount of fluorine and fin material. In an embodiment, the gate sidewall spacers and channel region of the fin include 1 atomic % to 10 atomic % of fluorine based on the total amount of fluorine and gate sidewall spacer material or fin material, respectively. In an embodiment, the gate dielectric layer is a high-k gate dielectric layer. In an embodiment, the semiconductor device includes an interfacial oxide layer disposed between the fin and the gate dielectric layer. In an embodiment, the semiconductor device includes a metal nitride layer disposed between the gate dielectric layer and the gate electrode layer. In an embodiment, the metal nitride layer includes one or more layers of TaN, TiN, or TiN doped with Si. In an embodiment, a thickness of the metal nitride layer ranges from 0.5 nm to 5 nm. In an embodiment, the semiconductor device includes source/drain regions disposed on the fin along the gate sidewall spacers on opposing sides of the gate electrode structures.

An embodiment of the present disclosure is a semiconductor device including a plurality of fins extending along a first direction on a semiconductor substrate. The semiconductor substrate includes a first region and a second region, and the plurality of fins are disposed on the first and second regions of the semiconductor substrate. A plurality of gate electrode structures extend along a second direction substantially perpendicular to the first direction over the fins. The electrode structures each comprise a gate dielectric layer and a gate electrode layer disposed over the sacrificial gate dielectric layer. Opposing gate sidewall spacers extend along the second direction on opposing sides of the gate electrode layer. The gate sidewall spacers in the first region include 0.25 atomic % to 15 atomic % of fluorine based on a total amount of fluorine and gate sidewall spacer material. In an embodiment, the gate electrode structures are disposed over channel regions of the fins, and the channel regions of the fins in the first region include 0.25 atomic % to 15 atomic % of fluorine based on a total amount of fluorine and fin material. In an embodiment, the gate sidewall spacers in the first region include 1 atomic % to 10 atomic % of fluorine based on the total amount of fluorine and gate sidewall spacer material. In an embodiment, the channel regions in the first region include 1 atomic % to 10 atomic % of fluorine based on the total amount of fluorine and fin material. In an embodiment, the first region is a core region of the semiconductor device, and the second region is an input/output (I/O) region of the semiconductor device. In an embodiment, the semiconductor device includes an interfacial oxide layer disposed between the fin and the gate dielectric layer in the first region. In an embodiment, the semiconductor includes a conductive barrier layer disposed between the gate dielectric layer and the gate electrode layer in the first region. In an embodiment, the conductive barrier layer is a metal nitride layer.

An embodiment of the present disclosure is a semiconductor device including a fin extending along a first direction on a semiconductor substrate, and a gate electrode structure extending along a second direction substantially perpendicular to the first direction over a channel region of the fin. The gate electrode structure includes a high-k gate dielectric layer and a gate electrode layer disposed over the gate dielectric layer. An interfacial oxide layer is disposed between the fin and the gate dielectric layer. A conductive barrier layer is disposed between the gate dielectric layer and the gate electrode layer. Opposing gate sidewall spacers extend along the second direction on opposing sides of the gate electrode layer. The gate sidewall spacers include 0.25 atomic % to 15 atomic % of fluorine based on a total amount of fluorine and gate sidewall spacer material, and the channel region of the fin includes 0.25 atomic % to 15 atomic % of fluorine based on a total amount of fluorine and fin material. In an embodiment, the gate sidewall spacers and channel region of the fin include 1 atomic % to 10 atomic % of fluorine based on the total amount of fluorine and gate sidewall spacer material or fin material, respectively. In an embodiment, the conductive barrier layer comprises one or more layers of TaN, TiN, or TiN doped with Si.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
   forming a fin extending along a first direction on a semiconductor substrate;
   forming a sacrificial gate electrode structure extending along a second direction substantially perpendicular to the first direction over the fin,
   wherein the sacrificial gate electrode structure comprises a sacrificial gate dielectric layer and a sacrificial gate electrode layer disposed over the sacrificial gate dielectric layer;
   forming opposing gate sidewall spacers, extending along the second direction, on opposing sides of the sacrificial gate electrode layer;
   removing the sacrificial gate electrode layer to form a gate space;
   implanting fluorine into the gate sidewall spacers after removing the gate electrode layer by performing a first fluorine ion implantation;
   removing the sacrificial gate dielectric layer;
   forming a high-k gate dielectric layer in the gate space; and
   implanting fluorine into the gate sidewall spacers and the fin after forming the high-k gate dielectric layer by performing a second fluorine ion implantation.

2. The method according to claim 1, wherein the first fluorine ion implantation is performed at an energy ranging from 50 eV to 500 eV, and a dose ranging from $1 \times 10^{13}$ atoms/cm$^2$ to $1 \times 10^{16}$ atoms/cm$^2$.

3. The method according to claim 1, wherein the second fluorine ion implantation is performed at an energy ranging from 50 eV to 500 eV, and a dose ranging from $1 \times 10^{13}$ atoms/cm$^2$ to $1 \times 10^{16}$ atoms/cm$^2$.

4. The method according to claim 1, further comprising forming an interfacial oxide layer on the fin in the gate space after removing the sacrificial gate dielectric layer and before forming the high-k gate dielectric layer.

5. The method according to claim 1, further comprising forming a metal nitride layer over the high-k gate dielectric layer.

6. The method according to claim 5, further comprising performing an annealing operation after forming the metal nitride layer.

7. The method according to claim 5, further comprising forming a silicon capping layer over the metal nitride layer.

8. The method according to claim 7, further comprising performing an annealing operation after forming the silicon capping layer.

9. A method for fabricating a semiconductor device, comprising:
   forming a plurality of fins extending along a first direction on a semiconductor substrate,
   wherein the semiconductor substrate comprises a first region and a second region, and the plurality of fins are formed on the first and second regions of the semiconductor substrate;
   forming a plurality of sacrificial gate electrode structures extending along a second direction substantially perpendicular to the first direction over the fins, wherein the sacrificial gate electrode structures each comprise a sacrificial gate dielectric layer and a sacrificial gate electrode layer disposed over the sacrificial gate dielectric layer;

forming opposing gate sidewall spacers, extending along the second direction, on opposing sides of the sacrificial gate electrode layer;

removing the sacrificial gate electrode layers from the plurality of gate electrode structures to form gate spaces;

masking the first region;

implanting fluorine into the gate sidewall spacers and the fins in the second region after removing the gate electrode layer by performing a first fluorine ion implantation;

removing the sacrificial gate dielectric layers in the second region;

forming high-k gate dielectric layers in the gate spaces in the second region; and implanting fluorine into the gate sidewall spacers and the fins in the second region after forming the high-k gate dielectric layers by performing a second fluorine ion implantation.

10. The method according to claim 9, wherein the first region is an input/output (I/O) region of the semiconductor device, and the second region is a core region of the semiconductor device.

11. The method according to claim 9, wherein the first fluorine ion implantation is performed at an energy ranging from 50 eV to 500 eV, and a dose ranging from $1 \times 10^{13}$ atoms/cm$^2$ to $1 \times 10^{16}$ atoms/cm$^2$.

12. The method according to claim 11, wherein the second fluorine ion implantation is performed at an energy ranging from about 50 eV to about 500 eV, and a dose ranging from $1 \times 10^{13}$ atoms/cm$^2$ to $1 \times 10^{16}$ atoms/cm$^2$.

13. The method according to claim 9, further comprising:

forming an interfacial oxide layer in the gate spaces by a chemical oxidation process after removing the sacrificial gate dielectric layer and before forming the high-k gate dielectric layer.

14. The method according to claim 13, further comprising forming a metal nitride layer over the high-k gate dielectric layer.

15. The method according to claim 14, wherein the metal nitride layer is a TiN layer.

16. The method according to claim 14, further comprising forming a silicon capping layer over the metal nitride layer before performing the second fluorine ion implantation.

17. A method for reducing the dielectric constant of gate sidewall spacers of a semiconductor device, comprising:

implanting fluorine into a pair of adjacent gate sidewall spacers of the semiconductor device by performing a first fluorine ion implantation;

forming a high-k gate dielectric layer between the pair of adjacent gate sidewall spacers;

forming a barrier layer on the high-k gate dielectric layer;

forming a silicon capping layer over the barrier layer; and implanting fluorine into the gate sidewall spacers and a channel region of the semiconductor device after forming the silicon capping layer by performing a second fluorine ion implantation.

18. The method according to claim 17, wherein the first fluorine ion implantation is performed at an energy ranging from 50 eV to 500 eV, and a dose ranging from $1 \times 10^{13}$ atoms/cm$^2$ to $1 \times 10^{16}$ atoms/cm$^2$.

19. The method according to claim 17, wherein the second fluorine ion implantation is performed at an energy ranging from 50 eV to 500 eV, and a dose ranging from $1 \times 10^{13}$ atoms/cm$^2$ to $1 \times 10^{16}$ atoms/cm$^2$.

20. The method according to claim 19, further comprising forming an interfacial oxide layer between the pair of adjacent gate sidewall spacers by a chemical oxidation process before forming the high-k gate dielectric layer.

* * * * *